United States Patent
Farmer et al.

(10) Patent No.: US 9,620,622 B2
(45) Date of Patent: Apr. 11, 2017

(54) REPLACEMENT METAL GATE DIELECTRIC CAP

(71) Applicant: International Business Machines Corporation, Armonk, NY (US)

(72) Inventors: Damon B. Farmer, White Plains, NY (US); Michael A. Guillorn, Cold Springs, NY (US); Balasubramanian Pranatharthiharan, Watervliet, NY (US); George S. Tulevski, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/189,579

(22) Filed: Jun. 22, 2016

(65) Prior Publication Data
US 2016/0308026 A1    Oct. 20, 2016

Related U.S. Application Data

(62) Division of application No. 14/551,322, filed on Nov. 24, 2014.

(51) Int. Cl.
| | | |
|---|---|---|
| *H01L 21/768* | (2006.01) | |
| *H01L 21/311* | (2006.01) | |
| *H01L 21/3105* | (2006.01) | |
| *H01L 29/66* | (2006.01) | |
| *H01L 29/78* | (2006.01) | |

(Continued)

(52) U.S. Cl.
CPC .. *H01L 29/66545* (2013.01); *H01L 21/02172* (2013.01); *H01L 21/28247* (2013.01); *H01L 21/31051* (2013.01); *H01L 21/31133* (2013.01); *H01L 21/31144* (2013.01); *H01L 21/32136* (2013.01); *H01L 21/76802* (2013.01); *H01L 21/76829* (2013.01); *H01L 21/76834* (2013.01); *H01L 21/76897* (2013.01); *H01L 29/401* (2013.01); *H01L 29/41775* (2013.01); *H01L 29/66795* (2013.01); *H01L 29/78* (2013.01); *H01L 29/517* (2013.01)

(58) Field of Classification Search
CPC ......... H01L 29/66545; H01L 29/42372; H01L 29/66553; H01L 29/517; H01L 29/78; H01L 21/283; H01L 21/02216
USPC .......................................... 438/299, 591, 585
See application file for complete search history.

(56) References Cited

U.S. PATENT DOCUMENTS

| | | |
|---|---|---|
| 7,029,999 B2 | 4/2006 | Lim et al. |
| 7,214,579 B2 | 5/2007 | Widdershoven et al. |

(Continued)

OTHER PUBLICATIONS

Anonymous, "Method for a Self Aligning Contact (SAC) with Replacement Metal Gate (RMG)," An IP.com Prior Art Database Technical Disclosure, Jan. 27, 2011, 5 pages. IP.com No. IPCOM000203531D.

(Continued)

*Primary Examiner* — Caleen Sullivan
(74) *Attorney, Agent, or Firm* — Joseph W. Cruz

(57) ABSTRACT

A method for manufacturing a field effect transistor includes chelating a molecular mask to a replacement metal gate in a field effect transistor. The method may further include forming a patterned dielectric layer on a bulk dielectric material and a gate dielectric barrier in one or more deposition steps. The method may include removing the molecular mask and exposing part of the gate dielectric barrier before depositing a dielectric cap that touches the gate dielectric barrier and the replacement metal gate.

3 Claims, 7 Drawing Sheets

(51) Int. Cl.

| | | |
|---|---|---|
| *H01L 21/02* | (2006.01) | |
| *H01L 21/28* | (2006.01) | |
| *H01L 21/3213* | (2006.01) | |
| *H01L 29/40* | (2006.01) | |
| *H01L 29/417* | (2006.01) | |
| *H01L 29/51* | (2006.01) | |

(56) References Cited

U.S. PATENT DOCUMENTS

| | | |
|---|---|---|
| 7,256,114 B2 | 8/2007 | Holmes et al. |
| 7,344,910 B2 | 3/2008 | Rhodes |
| 7,875,519 B2 | 1/2011 | Rachmady et al. |
| 7,888,220 B2 | 2/2011 | Rachmady et al. |
| 8,084,311 B1 | 12/2011 | Horak et al. |
| 8,293,631 B2 | 10/2012 | Dyer et al. |
| 2004/0185600 A1 | 9/2004 | Kagan et al. |
| 2013/0309834 A1 | 11/2013 | Hsieh et al. |

OTHER PUBLICATIONS

Hausmann et al., "Rapid Vapor Deposition of Highly Conformal Silica Nanolaminates," Science, vol. 298, Oct. 11, 2002, 5 pages.
IBM, "Self-Aligned Diffusion Contact Process," An IP.com Prior Art Database Technical Disclosure, Original Publication Dec. 1, 1987, IP.com Electronic Publication Feb. 2, 2005, 3 pages. IP.com No. IPCOM000040598D.
Farmer et al., "Replacement Metal Gate Dielectric Cap," U.S. Appl. No. 14/551,322, filed Nov. 24, 2014.
Farmer et al., "Replacement Metal Gate Dielectric Cap," U.S. Appl. No. 15/182,726, filed Jun. 15, 2016.
List of IBM Patents or Patent Applications Treated as Related, dated Jun. 20, 2016, 2 pages.

REPLACEMENT METAL GATE DIELECTRIC CAP

BACKGROUND

The present disclosure relates to a dielectric layer deposited on the gate electrode of a transistor structure built using a replacement metal gate integration scheme. Replacement metal gates may be formed on semiconductor substrates to permit the flow of electrical current from a source to a drain in a field effect transistor by applying a voltage to the gate. Metal contacts form part of an electrical circuit that runs through a source region, a channel beneath the gate, and a drain region.

SUMMARY

Aspects of the present disclosure may be directed toward an assembly comprising: a field effect transistor stack with a chelating mask chelated to the metal top surface and fill top surface of a replacement metal gate in the field effect transistor stack. The field effect transistor stack may have a replacement metal gate with a gate metal having a metal top surface and a gate fill with a fill top surface. A gate oxide may surround the gate metal and rest on a horizontal surface of a semiconductor substrate. A bulk dielectric material may also rest on the horizontal surface. A spacer may be between the bulk dielectric material and the gate oxide and rest on the horizontal surface.

Various embodiments are directed toward a semiconductor device comprising a replacement metal gate stack for a field effect transistor, having: The field effect transistor stack may have a replacement metal gate with a gate metal having a metal top surface and a gate fill with a fill top surface. A gate oxide may surround the gate metal and rest on a horizontal surface of a semiconductor substrate. A bulk dielectric material may also rest on the horizontal surface. At least one spacer may be between the bulk dielectric material and the gate oxide and rest on the horizontal surface. A dielectric cap may be on the metal top surface and the fill top surface and touch the at least one spacer.

Embodiments are directed toward a method of manufacturing a field effect transistor with a dielectric cap. The method may begin by chelating a molecular mask to the top surface of a replacement metal gate in a field effect transistor. The method may also include using the molecular mask to create a patterned dielectric layer on a bulk dielectric material and a gate dielectric barrier. The method includes exposing a region of the gate dielectric barrier and depositing a dielectric cap to touch the gate dielectric barrier and the replacement metal gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
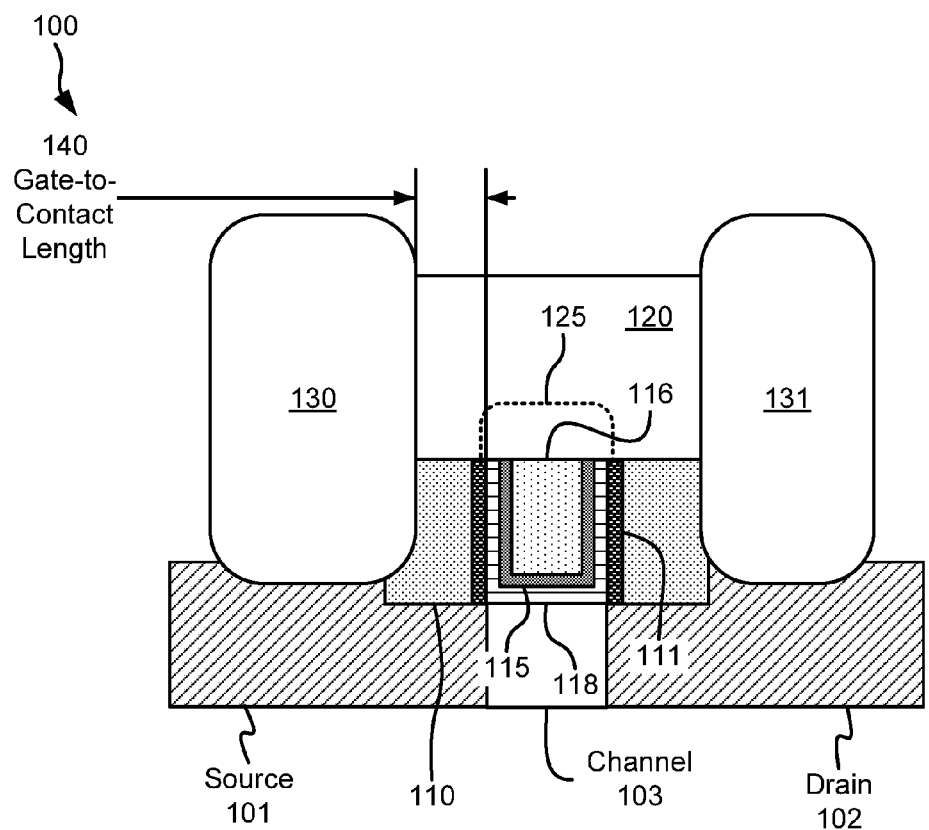
FIG. 1 depicts a replacement metal gate as part of a field effect transistor, according to aspects of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to field effect transistors (FETs), and more particular aspects relate to replacement metal gates that may be in field effect transistors including field effect transistors with fins (finFETs). Aspects of the present disclosure may relate to replacement metal gates on which a dielectric cap is formed to protect the replacement metal gate during the process of creating source and drain contacts. Dielectric caps may be relevant to overcome lithographic overlay challenges and to permit formation of self-aligned contacts above source and drain regions adjoining replacement metal gates. While the present disclosure is not necessarily limited to such applications, various aspects of the disclosure may be appreciated through a discussion of various examples using this context.

As semiconductor technology advances, the dimensions of transistors and the spacing between transistors become smaller. Aspects of the present disclosure are based upon the recognition that the use of a dielectric cap on top of a replacement metal gate may provide additional protection to the replacement metal gate in a FET or finFET during the formation of contact holes above source and drain regions. For instance, dielectric caps on top of replacement metal gates may protect the gates from misplaced contact holes that may occur with errors in lithographic alignment.

According to particular embodiments, a replacement metal gate stack can be protected during manufacturing by raising the encapsulating dielectric using a selective deposition process. This selective process involves the use of the gate materials that have been functionalized with a molecule that prevents the deposition of material on that surface while allowing deposition on the field oxide raising the oxide up above the plane of the gate stack material. This can be particular useful for providing a self-aligned process that does not use an etching process to recess the gate stack material.

The use of dielectric cap may prevent some yield detractors in integrated circuit manufacturing as lithographic tolerances shrink, and especially for transistors having gates smaller than 25 nanometers (nm). Dielectric caps may prevent etch plasma, used to form contact holes, from eroding or otherwise damaging replacement metal gates. Gate transistors having lengths of 22 nm, and below may benefit from dielectric cap protection of metal gates. For gate pitches below 100 nm, it may be beneficial to adopt strategies such as dielectric caps to allow contacts to self-align over gate structures to protect the gate from problems associated with lithographic alignment errors. Situations where multiple patterning is used to create narrow gates at gate pitches below 200 nm may also benefit from the use of dielectric caps on top of narrow gate structures to protect them from plasma damage during steps subsequent to the formation of the gate, especially steps involving the formation of contacts that connect to source and drain regions.

Source and drain contacts adjoining transistors may be configured to penetrate through layers of bulk dielectric material to make electrical contact with semiconducting source and drain regions with the expectation that lithographic overlay tolerances are sufficiently tight that unintentional damage to gate structures not occur. Dielectric caps may be relevant for field effect transistors with small gate pitches in order to protect spacers (layers of dielectric materials deposited on the sides of transistor gates to protect those gates) and gate structures (by preventing any electrical connection between the gate and the source and drain contacts if a contact opening partially overlays a gate or a spacer adjoining a gate).

Various methods of creating dielectric caps on top of replacement metal gates may be used, incorporating combinations of different types of masks in order to pattern the surface of the semiconductor wafer and form the dielectric caps. In some embodiments, masks may be used to prevent the deposition of materials on top of the replacement metal gate while depositing dielectric materials on the wafer surface beyond the edges of the replacement metal gate. In embodiments, after removing a mask protecting a replacement metal gate, a cap material may be deposited on the wafer surface to protect the replacement metal gate and to remain permanently on top of the replacement metal gate. With a cap atop a replacement metal gate, some embodiments may undergo chemical and mechanical polishing (CMP) steps in order to planarized the wafer surface before patterning the wafer and using selective etching chemistries to create contact openings over the source and drain regions. Selective chemistries may be reactive with bulk dielectric materials but minimally reactive (or nonreactive) with materials used in dielectric caps and replacement metal gate spacers. Dielectric caps may reduce the damage to transistors caused by unintended lithographic patterning overlay of replacement metal gates, such as when a spacer or a replacement metal gate is exposed to etch plasma during the formation of a contact opening. Protective dielectric caps may allow a contact to conform to the shape of a replacement metal gate without making contact with the gate or disrupting the function of the FET or finFET.

In various embodiments of dielectric caps on top of replacement metal gates, the dielectric caps may make contact with a gate dielectric barrier. This gate dielectric barrier may be a spacer, a gate oxide, or both a spacer and a gate oxide, according to embodiments. The top surfaces of the gate dielectric barriers may be exposed by recessing the sides of patterned dielectric layer openings. The interior surfaces of the gate dielectric barrier may also be exposed by recessing the replacement metal gate downward toward the substrate on which the finFET rests. A dielectric cap may be deposited within the openings of a patterned dielectric layer and touching the top surface of the replacement metal gate and the gate dielectric barrier. In embodiments where the replacement metal gate is recessed downward, the dielectric cap may also make contact with interior surfaces of the gate dielectric barrier (forming a "plug" of material that sits inside the gate dielectric barrier). The degree of protection of the replacement metal gate by the dielectric cap may correlate with the amount of and quality of the interface between the gate dielectric barrier and the dielectric cap material.

According to aspects of the present disclosure, soft masks may be used to protect the top surface of an exposed replacement metal gate as dielectric material is deposited on the wafer surface. Dielectric material may be deposited in stages or layers of varying thickness. Some embodiments of integrated circuits may be formed with multiple thin contact layers of a single type of material, while other embodiments may include multiple layers of different materials. Other embodiments may be formed by catalytically growing thick layers of dielectric material using a thin layer of metal (such as aluminum) as a seed layer to promote the cross-linking of reactants.

In some embodiments, the material of the soft mask material or soft mask molecules may desorb from the top of the replacement metal gate. In other embodiments, the soft mask may lose selectivity to the dielectric material and growth of dielectric films occur in stages according to the depositional selectivity of mask materials that protect the replacement metal gates. A particular replacement metal gate mask (such as a soft mask), may be selective to (e.g., resistant to) deposition of dielectric material for a period of time or for the deposition of a certain amount of dielectric material on the wafer surface beyond the edges of the soft mask. Continuing dielectric material deposition beyond the period of time or amount of dielectric material may allow dielectric material to form atop the soft mask, or displace some of the chelated mask, or may erode the soft mask and allow deposition of dielectric material directly on the replacement metal gate. In such circumstances, the final layer of protective cap material may be too thin or have incomplete coverage of the replacement metal gate, increasing the risk of device damage during subsequent contact formation steps. Soft mask deposition, dielectric growth (whether direct deposition or catalytic growth), and soft mask removal may be repeated multiple times in order to build up the thickness of the dielectric material. The thickness of dielectric material outside the footprint (on the top surface of the semiconductor wafer) of the replacement metal gate may be greater than the thickness of the protective cap material deposited on top of the replacement metal gate without interfering with contact formation.

FIG. 1 depicts a replacement metal gate in a field effect transistor 100, according to aspects of the present disclosure. Here it may be seen how the contacts adjacent to a gate penetrated the dielectric material to reach the source and drain regions, and how misalignment of the contact may lead to gate damage. The field effect transistor 100 may rest on a semiconductor substrate having a source 101 and a drain 102 with a channel 103 resting between the source 101 and the drain 102. A bulk dielectric material 110 may also rest on top of the semiconductor substrate on both the source side and the drain side of the channel 103. A spacer 111 may extend from the top of the bulk dielectric material 110 down through the material, on both sides of the replacement metal gate, to make contact with the semiconductor substrate. Replacement metal gates may have a spacer on both sides of the replacement metal gate so that replacement metal gate does not touch the bulk dielectric material at any point during the manufacturing process.

A first step in making a replacement metal gate may be to deposit a layer of silicon atop a semiconductor substrate and then create a photolithographic pattern on top of the silicon. A manufacturer may then etch the silicon using the photolithographic pattern in order to create dummy gates. Dummy gates may act as structural supports for the deposition of spacers on the sides of the dummy gates prior to the deposition of bulk dielectric material between the dummy gates with their spacer sidewalls. After planarization that can expose the top surface of the dummy gate and spacer sidewalls, the manufacturer may chemically etch the dummy gate material away to form an opening into which other materials may be deposited.

A manufacturer may begin by depositing a gate oxide 118 into the open created by removing the dummy gate material. A gate oxide 118 may contain but not be limited to materials such as hafnium, zirconium, silicon, oxygen, nitrogen, aluminum, and lanthanum (Hf, Zr, Si, O, N, Al, and La) in various combinations. The gate oxide 118 may be conformally deposited onto the insides of the spacers 111 and on top of the channel 103. The gate oxide 118 may act as a barrier between the channel region 103 and the replacement metal gate. A gate metal 115 made of materials such as, but not limited to, tungsten, tantalum, carbon, titanium, aluminum, cobalt, molybdenum, ruthenium, titanium nitride, and titanium carbide (W, Ta, C, Ti, Al, Co, Mo, Ru, TiN, and TiC) or combinations thereof, in one or more layers. The gate metal 115 may be deposited, as a conformal layer, within the opening on the interior sidewalls of the spacers and on the bottom of the opening, resting on the semiconductor substrate directly above the channel. Depositing of the gate metal may be accomplished through methods that include, but are not necessarily limited to, atomic layer deposition, chemical vapor deposition, physical vapor deposition, electrodeposition, or combinations of these techniques. A gate fill 116 metal can include, but are not necessarily limited to, tungsten, cobalt, ruthenium, aluminum, and titanium-aluminum (W, Co, Ru, Al, and TiAl). The gate fill metal may be deposited within the opening formed by the deposited gate metal 115.

A dielectric cap 125 may be formed atop the replacement metal gate in order to protect it from accidental erosion during formation of contacts above the source and drain regions. At least one layer of dielectric material 120 may be deposited on top of the dielectric cap 125 and the replacement metal gate stack. Openings for source and drain contacts may be etched through dielectric material 120 as well as the bulk dielectric material 110 prior to the creation of the source contact 130 and the drain contract 131. One relevant design element of very small transistors is the amount of space between the contact (such as the source contact 130) and the replacement metal gate, including both the gate metal 115 and the gate fill 116. This gate to contact length 140 may be increasingly relevant as gate pitches, transistor sizes and gate lengths shrink. When the lithographic pattern for a source contact or a drain contact opening is correctly placed, integrated circuit design rules may indicate a certain minimum desired space between the side of the contact or contact opening and the gate metal and gate fill of the replacement metal gate. However, as device sizes shrink, the size of lithographic overlay errors becomes more relevant because accidental misalignment of features such as a contact opening may have adverse effects on the FET by eroding the spacer or the replacement metal gate during contact etching. Without a dielectric cap, portions of the spacer 111 may be eroded or damaged enough to create an opening through which contact metal may connect with the replacement metal gate, shorting the transistor. Because plasma etches to create contact openings are highly directional, growth of a dielectric cap to protect the top side of spacer 111 may provide sufficient protection for the spacer to reduce the frequency of FET damage and increase overall integrated circuit yield.

Figure 2:
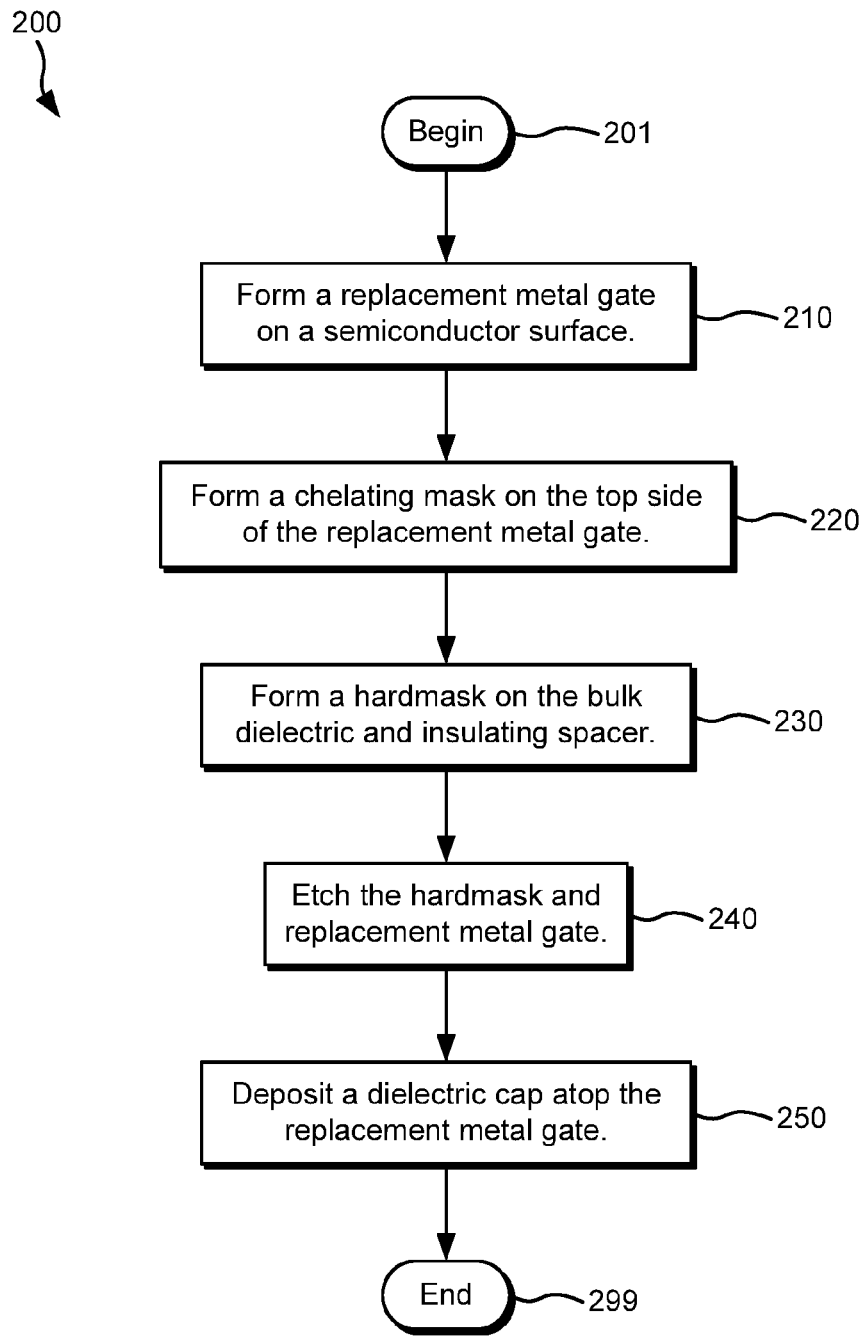
FIG. 2 describes a method of forming a dielectric cap atop a replacement metal gate according to embodiments of the present disclosure.

FIG. 2 describes a method 200 of forming a dielectric cap atop a replacement metal gate according to embodiments of the present disclosure. The method begins in block 201. A manufacturer may first form a replacement metal gate on a semiconductor surface, as described in FIG. 1, according to block 210. The process of forming a replacement metal gate may include formation of dummy gates, sidewall spacer deposition, bulk dielectric deposition, wafer planarization, removal of the dummy gate and emplacement of gate metal and gate fill before a final planarization step.

The method may include a step wherein a soft mask (a molecular mask that may be removed from the wafer surface by such methods as etching with oxygen plasma or rinsing with water or another solvent) in the form of a chelated mask is deposited on top of the semiconductor wafer surface, as described in block 220. Forming an assembly out of the semiconductor stack and the chelating (molecular) mask may allow the manufacturer to pattern the wafer during a deposition step rather than depositing a blanket film and performing patterning and etching in subsequent steps. The chelating mask may be formed on top of the replacement metal gate, but not on top of the spacer dielectric material or the bulk dielectric material, because of the chemical structure of the chelating mask molecules. Mask molecules may have a chelating end and a hydrophobic end. The hydrophobic end may comprise one or more long carbon-containing chains or rings with hydrogen, fluorine, or a combination of hydrogen and fluorine attached to the carbon atoms. In an aqueous solution or an alcohol solution, hydrophobic ends of molecules may tend to be attracted to each other, while chelating ends (that may be hydrophilic) may preferentially complex with water or alcohol or other solution molecules. After depositing a solution with mask molecules onto a wafer surface, the hydrophobic tail ends may tend to be attracted to each other while the chelating ends may preferentially chelate with exposed parts of semiconductor devices, including replacement metal gates or other metal areas.

The chelating end may be a Lewis acid with pairs of unbonded electrons that may be attracted to atoms in the replacement metal gate, and more particularly to metal atoms or metalloid atoms, which may form chelates or chelation complexes, or may simply attract the chelating molecules to the surface of the gate. The chelating end of a chelating mask molecule may be a phosphonate (an ester formed from phosphonic acid) or a hydroxamate (an ester formed from hydroxamic acid), although other chelation-prone functional groups may also serve to form chelating masks.

If a solution of chelating mask molecules is applied to a semiconductor wafer with an exposed replacement metal gate (such as may occur after planarization of the semiconductor wafer surface), the chelating end of the chelating mask module may be attracted to the replacement metal gate to form chemical or dative bonds between the chelating end and the atoms of the replacement metal gate. The hydrophobic ends of the chelating mask molecules, whether containing long chain alkyl groups or aryl groups (aromatic rings, etc . . . ), may be attracted to each other, leading them to self-align during soft mask formation and to remain aligned after the deposition solution is removed and the wafer is dried. The soft chelating mask may form a protective film atop the exposed replacement metal gate materials. Upon completion of some subsequent processing steps, chelating mask molecules may be removed from the exposed surface of a replacement metal gate by aqueous processing (such as at high or low pH) or by processing with an oxygen-containing plasma to eliminate the mask molecules.

According to embodiments, the chelating mask molecules may be deposited onto a wafer surface by: first, cleaning a wafer, such as with ultraviolet light and ozone, or oxygen plasma, or with water plasma treatments; second, preparing a dilute solution of chelating mask molecules (such as octadecylphosphonic acid) in an aqueous or alcohol (ethanol) solution; third, applying the soft chelating mask such as by soaking the cleaned wafer surface in the dilute solution of mask molecules; and fourth, rinsing the wafer to remove non-chelated mask molecules from the wafer surface.

With a chelating mask in place on a replacement metal gate, it may be possible to form a patterned dielectric layer on top of the bulk dielectric and spacer materials, as indicated in block 230. Forming the patterned dielectric layer may be performed using deposition with a mask rather than depositing a blanket layer of dielectric material, patterning on top of the dielectric layer, and then etching the dielectric layer because photolithographic alignment may be imprecise, or because the process of etching the blanket dielectric layer may be insufficiently selective to spacer materials on the sides of the replacement metal gate. Formation of the patterned dielectric may be accomplished by methodologies such as atomic layer deposition (ALD), wherein gaseous reaction products introduced above the surface of a semiconductor wafer may adsorb (or chemisorb, or physisorb) to the surface of the wafer, perhaps forming a monolayer of reactant. Upon exposure of the semiconductor wafer surface with the first layer of reactant to a second reactant, a chemical reaction may take place on the wafer surface to grow a new layer of material on top of the first layer. According to various methods of epitaxial growth, subsequent layers of material grown on the semiconductor wafer may be identical to the first layer, or may be chemically distinct from the first layer depending on the nature of the chemical reactants to which the semiconductor wafer surface is exposed.

One method of growing a dielectric layer may be to form an oxide layer such as silicon dioxide or hafnium oxide directly atop the exposed top surfaces of the bulk dielectric material and the spacer. Silicon dioxide and hafnium oxide may be more difficult to etch than either the bulk dielectric material between replacement metal gates or the spacer. Direct growth may be a relatively slow method of growing a patterned dielectric layer, but may permit a wide range of materials to be grown according to the chemical precursors selected.

Another method of growing a patterned dielectric layer may be to deposit, at elevated temperatures, a seed layer of a metal such as aluminum onto the exposed top surface of the bulk dielectric material and the spacer. A seed layer of aluminum may be deposited onto dielectric materials using a gas such as trimethyl aluminum $[(CH_3)_3Al]$, whereupon the aluminum atom may form a chemical bond with the atoms in the surface of the dielectric. Subsequent exposure of the surface, covered with aluminum (and methyl groups), with a silanol compound such as tris(tert-butoxy)silanol $[(Bu^tO)_3SiOH]$ may trigger a catalytic reaction between the silanol and the aluminum resulting in the formation of cross-linked silicon and oxygen bonds in a silicon dioxide layer on top of the aluminum (and also resulting in the conversion of methyl groups from the trimethyl aluminum and the silanol to methane). Catalytically grown silicon dioxide from an aluminum seed layer on a dielectric material may produce very thick layers of silicon dioxide tens of times faster than direct growth methods of atomic layer deposition. Other compounds may be used to form the layer using a catalytic growth method, provided that the metal or metalloid can complex with tert-butoxy groups (or similar oxygen-containing groups) in a manner similar to the silanol mentioned above.

After the patterned dielectric layer has been formed, whether by direct growth or by a catalytic growth method, manufacturers may etch the dielectric layer and the replacement metal gate, as described in block 240. Prior to etching the wafer surface, the chelating mask molecules may be removed by aqueous processing (i.e., such as at a pH different from that used to form the chelating mask) or with application of an organic solvent or by processing with an oxygen-containing plasma to eliminate the mask molecules in order to proceed with subsequent processing. In some embodiments, the etching step may remove part of the gate metal and gate fill from the replacement metal gate to expose some of the interior sidewall of the replacement metal gate's spacers. Such etching may be in an aqueous environment, or may be accomplished by a chemical plasma attuned to the particular composition of the replacement metal gate stack. Chemical plasma etch of a replacement metal gate may be a directional etch process that attacks and removes part of the replacement metal gate stack without damaging the patterned oxide layer that covers the top of the spacer the bulk dielectric material.

In other embodiments, the etching process may be non-directional or anisotropic in order to perform a lateral recess of the oxide layer to widen the opening and expose part of the spacer. When the chelating mask is formed atop the replacement metal gate, the patterned oxide layer that is formed may have an opening within it conforming to the shape of the chelating mask on the top of the replacement metal gate. Because the initial oxide layer has an opening corresponding to the shape of the chelating mask, subsequent layers of the oxide may adhere to the opening pattern closely corresponding to the dimensions of the chelating mask. Etching the oxide layer with, for example, an aqueous mixture of acids, may both thin the oxide layer and also increase the size of the opening.

After etching the wafer surface to either recess the replacement metal gate or to increase the size of the openings to expose a region of the spacer, a manufacturer may deposit a dielectric cap on top of the exposed replacement metal gate, as indicated in block 250. According to aspects of the present disclosure, a portion of the cap may be in contact with an interior sidewall of the spacer (the interior sidewall of the spacer may be the portion of spacer which was previously in contact with gate metal or gate fill and which was exposed by the etching process). In other embodiments, the replacement metal gate may not be recessed down to expose a side of the spacer, but the oxide may be laterally etched to expose a top region of the spacer. Deposition of a dielectric cap material on the semiconductor wafer surface may cover the top side of the wafer and fill the recessed portions of the wafer.

In some embodiments, particularly embodiments where a seed layer is used to create an oxide layer atop the bulk dielectric and spacer materials, some or all of the seed layer used to promote the growth of a patterned oxide layer may remain on the top side of the spacer. When portions of the seed layer may have been removed during prior processing steps, a portion of the dielectric cap material may be in direct contact with portions of the spacer material beneath areas where the seed layer has been removed. In other embodiments, the seed layer may be incorporated into the dielectric cap during the deposition process in order to form a contiguous interface between spacer material and dielectric cap material.

In some embodiments, chemical and mechanical polishing or planarization may take place in order to expose portions of the oxide layer above the bulk dielectric material and reduce the thickness of the dielectric cap above the replacement metal gate. In other embodiments the oxide layer, whether grown by direct ALD deposition or by some seed layer-catalyzed process, may be removed using appropriate etch chemistries in order to expose the bulk dielectric material for subsequent processing to form openings for source and drain contacts to reach portions of the semiconductor wafer beneath the bulk dielectric material. The method ends in block 299.

Figure 3:
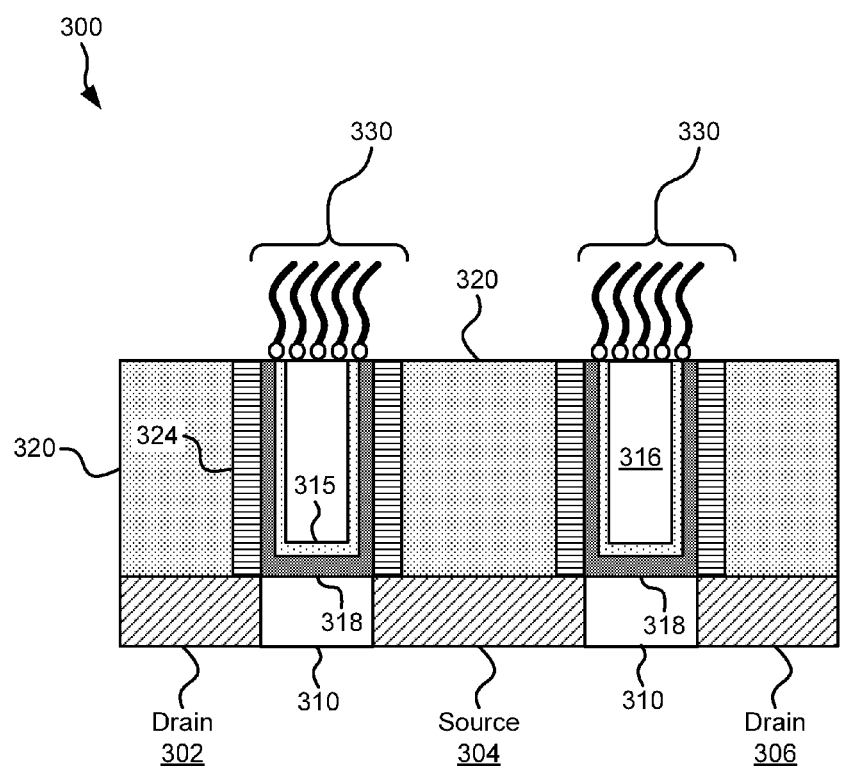
FIG. 3 shows chelating mask segments atop some replacement metal gates according to embodiments of the present disclosure.

FIG. 3 shows a replacement metal gate stack 300 with chelating mask segments, according to embodiments of the present disclosure, illustrating the placement of the chelating mask on the replacement metal gate, but not the spacer or gate oxide. Replacement metal gate stack may include a source 304 region in a semiconducting substrate and several drain regions 302, 306, within the semiconductor substrate. Between a source 304 region and a drain 302 region there may be a channel 310 through which current may flow in a completed device upon application of an appropriate voltage to the gate. Atop the semiconducting substrate there may be a bulk dielectric material 320 that touches a spacer 324 that lies completely between the bulk dielectric 320 and replacement metal gate.

There may be a gate oxide 318 that lines the insides of the spacer 324 and sits on top of the channel 310, and may have been deposited by a conformal deposition method such as epitaxial growth using atomic layer deposition. A replacement metal gate may rest on the inner surface of the gate oxide 318. A conformally deposited gate metal 315 may be deposited within or on top of the gate oxide 318 and a gate fill 316 may make up the remainder of the gate volume. The gate metal 315 may be made of compounds including, but not limited to W, Ta, C, Ti, Al, Co, Mo, Ru, TiN, TiC singly or in combinations. Gate fill 316 may be made of metals including, but not limited to, tungsten, cobalt, ruthenium, aluminum, titanium, and their alloys. The top of the semiconductor wafer may have been planarized such that the top of the dielectric material 320, the spacer material 324, the gate metal 315 and the gate fill 316 are approximately coplanar.

A chelating mask 330 may be located on each of the exposed replacement metal gates in the semiconductor wafer. The chelating mask may be made of a plurality of chelating mask molecules which contain a hydrophobic end and a chelating end. The chelating end may be a hydroxamate ester or a phosphonate ester, although other chelating groups may also work to attract the chelating mask molecules to the surface of the replacement metal gate.

As described above, the chelating ends of chelating mask molecules may be attracted to the atoms in the exposed portions of the replacement metal gate because they can form dative covalent bonds by sharing electrons in the chelating ends with the material in the replacement metal gate. The hydrophobic ends of the insulating mask molecules may be long alkyl groups or aryl groups (aromatic rings, etc.) that may self-attract in order to point roughly in the same direction, upward from the exposed surface of the replacement metal gate. These ends of the chelating mask molecules may be sufficiently long and dense that they protect the top surface of the replacement metal gate during formation of the patterned oxide layer.

Figure 4:
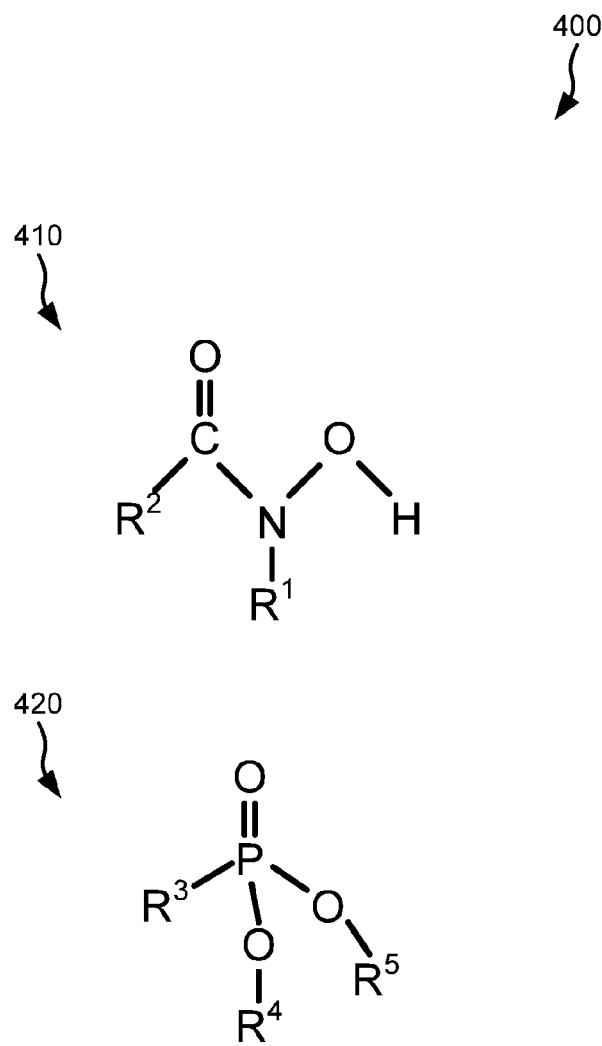
FIG. 4 shows representations of metal chelating agents that can help form chelating masks according to embodiments of the present disclosure.

FIG. 4 shows representations 400 of metal chelating agents or chelating functional groups that can help form chelated masks according to embodiments of the present disclosure. Metal chelating agents may include carboxylates, hydroxamates, phosphonates, and amines. Metal chelating agents may have hydrophobic ends that can serve to align the ends with each other. A hydroxamate ester 410 may contain two hydrophobic ends or tails, indicated by the symbols R1 and R2 on the molecular diagram. The tail ends may be identical or may be different in various embodiments. Hydroxamate ester 410 has a carbonyl group, a nitrogen atom, and another oxygen atom, each of which has unpaired electrons which may be used to attract and adhere the chelating end of the chelating mask molecules to atoms in the replacement metal gate. Other metal chelating agents may have common characteristics of unpaired electrons that can form chemical bonds with the substrate material. Other metal chelating agents such as carboxylates, phosphonates, and amines may also have unpaired electrons that can participate in bonding with the substrate.

Hydrophobic tail ends may have all carbon atoms be singly bonded to other carbon atoms or to hydrogen atoms. They may also be alkyl groups that where the hydrogen atoms have been partially or completely replaced with fluorine atoms or some other halogen atom. The hydrophobicity of the tail end may enhance the attraction of the tail ends to each other, and may also negatively influence the formation of oxide or other dielectric materials deposited on the semiconductor surface. The substitution of fluorine for hydrogen on an alkyl group may enhance the hydrophobicity of the chelating mask molecule's tail end. Fluorine substitution on the hydrophobic tail end may allow use of shorter carbon chains in the tails while maintaining hydrophobicity equivalent to that of longer carbon chain ends that contain only hydrogen and carbon.

The tail ends may have long carbon chains such as are found in octadecyl groups (having 18 carbon atoms in a single chain). Carbon chains of less than 40 atoms in length may be used in various embodiments. Carbon chains greater than 40 atoms in length may have difficulty dissolving in solutions before application to a wafer surface. In some embodiments of the present disclosure, the carbon chain may have one or more double bonds, or some degree of branching off of the linear carbon chain may be acceptable. Double bonds and branching of the carbon chain may adversely affect the solubility of the chelating mask molecule in solvents used to deposit the mask molecules on the wafer surface.

Phosphonates 420 may be used as chelating mask molecules in order to perform the masking functions described previously for hydroxamates. Phosphonates may have three different segments (R3, R4, and R5) that make up the tail end of the chelating mask molecule while the phosphorus and oxygen atoms at the branching point of may act as the chelating end of the molecule. Similar to hydroxamates, the oxygen atoms unpaired electrons may create an attraction between the chelating end of the chelating mask molecule and the atoms in the replacement metal gate. Also, as previously described for a hydroxamate molecule, segments R3, R4, and R5 may be identical in some embodiments, or may be different from each other in other embodiments. The precise identities of segments R3, R4, and R5, which may be hydrophobic and which may be long alkyl groups or aromatic rings (aryl groups) may vary in different embodiments according to the nature of the oxide layer being grown on top of the semiconductor wafer, according to the desired processing temperature of the patterned layer's growth steps, and according to solubility characteristics of the chelating mask molecules in the deposition solution.

Figure 5:
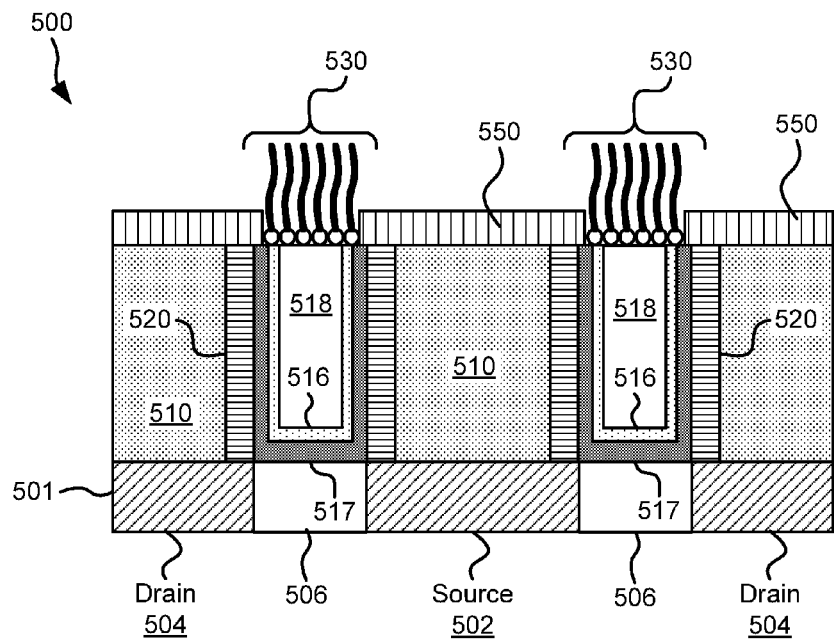
FIG. 5 shows replacement metal gates with a chelating mask and a patterned dielectric layer according to embodiments of the present disclosure.

FIG. 5 shows a cross section 500 of two replacement metal gates with a chelating mask and patterned oxide layer according to embodiments of the present disclosure, illustrating direct depositional growth of patterned oxide on the spacer outside the area (above the replacement metal gate) protected by the chelating mask. Replacement metal gates may be formed on a semiconductor substrate 501 having a source region 502 and a drain region 504. Between a source and drain region may be a channel 506 upon which a replacement metal gate may rest. A bulk dielectric material 510 may rest on top of the semiconductor substrate 501 and a spacer 520 may extend from the top side of the bulk dielectric material 510 to the top side of the semiconductor substrate 501 along the side of a replacement metal gate. Each replacement metal gate may have a spacer on both sides of the replacement metal gate to surround it and prevent it from touching the bulk dielectric material 510.

The replacement metal gate may have a thin, conformal layer of gate oxide 517 that covers the interior sides of the spacers adjoining the gate, and may further have a conformal layer of gate metal 516 deposited on gate oxide 517. Within the gate metal 516 there may be a gate fill 518 material that touches all interior portions of the gate metal and extends up to the top of the stack. The gate metal 516 and the gate fill 518 may be made of elements described previously in FIG. 1.

A chelating mask 530 may be present on top of the replacement metal gate (i.e., on top of the gate metal 516 and the gate fill 518) and may also cover or overlap part of the gate oxide 517 layer. The degree of coverage of the gate oxide 517 by the chelating mask 530 may relate to the length or size of the carbon chains in the tail ends of the chelating mask molecules. In some embodiments of the present disclosure, a patterned layer 550 may be deposited directly on top of the bulk dielectric material 510 and on the exposed top edge of each spacer 520 in the device. Because the chelating metal mask 530 may only be attracted to the replacement metal gate, patterned oxide may grow freely (using methods such as atomic layer deposition) upward from the bulk dielectric and spacer dielectric materials, with openings that correspond to the dimensions of the replacement metal gate covered by the chelating metal mask. The patterned layer 550 may be an oxide or some other material. Oxides may include silicon dioxide and hafnium oxide in embodiments.

Figure 6:
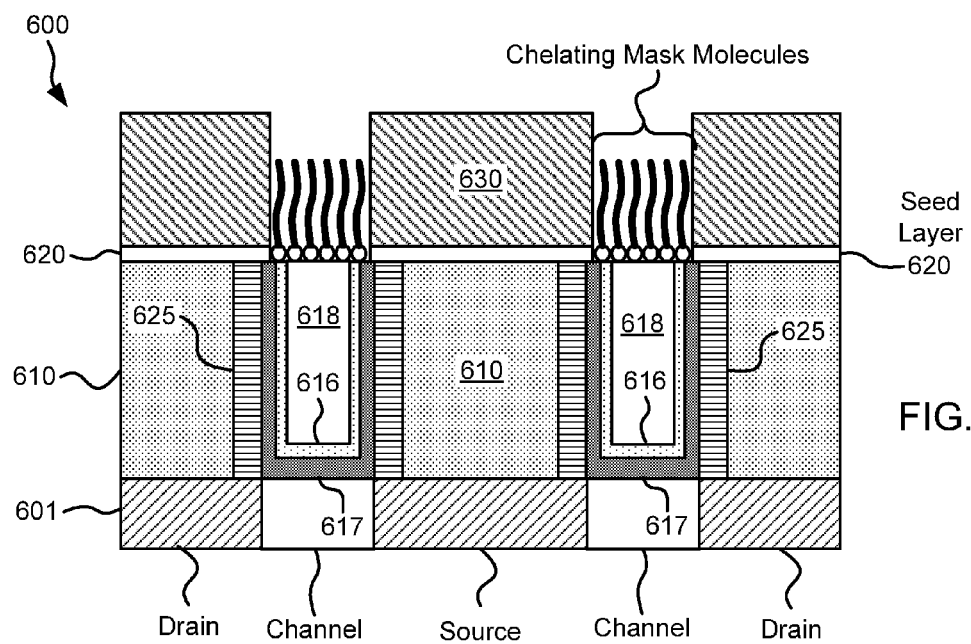
FIG. 6 shows a replacement metal gate with a seed layer and a patterned dielectric layer according to embodiments of the present disclosure.

FIG. 6 shows a replacement metal gate stack 600 with a seed layer 620 and a patterned oxide layer 630 according to embodiments of the present disclosure, illustrating the catalytic growth of a patterned oxide outside the limits of the chelating mask on top of the replacement metal gate. The catalytic growth occurs in areas where the seed layer was deposited on the wafer surface, which deposition is blocked by the chelating mask. The replacement metal gate stack may have a semiconductor substrate 601, further having a source region, a drain region, and channel regions. Bulk dielectric material 610 may rest on top of the semiconductor substrate and spacers 625 may extend from the top side of the bulk dielectric material 610 through the bulk dielectric material to touch the top of the semiconductor substrate 601. A gate oxide 617 may cover an interior side of each spacer 625 as well as the channel region in the semiconductor substrate 601. A gate metal 616 may cover the top surface of the gate oxide 617, and a gate fill 618 may make up the remainder of the replacement metal gate.

In some embodiments, a chelating mask made of chelating mask molecules such as described in FIG. 5 (see element 530) may have been deposited on the top surface of the gate metal 616 and the gate fill 618. A seed layer 620 may be deposited, using methods such as atomic layer deposition, onto the unmasked portions of the wafer, including areas of the bulk dielectric material 610 and the spacers 625. The seed layer 620, as previously described, may include catalytic metals such as aluminum which chemically bonds to the exposed portions of the wafer surface. The seed layer may be blocked from depositing on the wafer surface in a particular region by chelating mask molecules that were deposited on top of the metal gate prior to the seed layer deposition.

Subsequent processing steps may include exposing the wafer to compounds which contain elements that can form a catalytically grown dielectric material 630. For example, growth precursors such as silanols, with multiple silicon oxygen bonds, may react with aluminum on the wafer surface to form cross-linked silicon-oxygen bonds that ultimately form the oxide layer. Unlike directly grown dielectric layers as described in FIG. 2 and shown in embodiments consistent with FIG. 5, catalytically grown oxide layers may grow to significantly greater thicknesses during a single processing cycle before deposition of further seed layers may be desired. The pattern of the chelating mask, conforming to the shapes of the exposed replacement metal gate top surfaces, may be seen to persist as the dielectric is grown.

Figure 7:
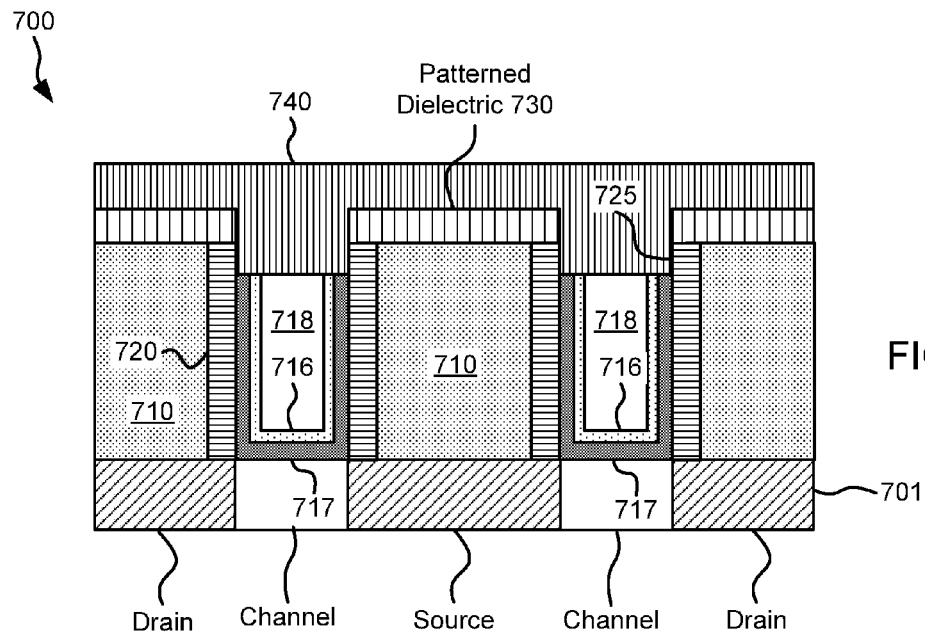
FIG. 7 shows a replacement metal gate, recessed after etching to expose a region of the spacer, with a dielectric film deposited on top, according to embodiments of the present disclosure.

FIG. 7 shows a cross section 700 of a replacement metal gate, recessed by an etching process in order to expose part of the spacer, after a dielectric film has been deposited on top, according to embodiments. The patterned oxide on the top of the wafer is a directly deposited oxide. A semiconductor substrate 701 may have source regions, drain regions, and channels with replacement metal gates positioned on and above the channels. A bulk dielectric material 710 may be deposited on top of the semiconductor substrate 701 with spacers 720 extending from the top surface of the bulk dielectric 710 down to the top of the semiconductor substrate 701. A gate oxide 717 may have been conformally deposited on the interior vertical surfaces of the spacers 720 (the interior vertical surface being the side of the spacer that faces the other spacer in a particular replacement metal gate) and may also cover the top surface of the semiconductor substrate 701 directly above a channel. A gate metal 716 may line the gate oxide 717. A gate fill 718 may have been deposited within the conformally deposited gate metal 716.

In some embodiments, an etch process may have been performed to recess the gate metal 716 and the gate fill 718 below the top surface. In other embodiments, the gate metal 716 and gate fill 718 recess may expose part of the gate oxide 717. The gate oxide 717 may partially or completely cover the interior vertical surface of the spacer 720. The exposed dielectric material (of spacer 720, shown here, or gate oxide 717 in other embodiments) may have an interior vertical surface 725 that can make contact with the dielectric cap material 740 subsequently deposited on the wafer surface. The blanket layer of dielectric cap material 740 may be partially removed by processes such as etching or chemical and mechanical polishing in order to expose the oxide layer 730 or the bulk dielectric material 710. This dielectric cap material 740 may fill the opening above the replacement metal gate and make close contact with the exposed spacer or the gate oxide and protect the replacement metal gate.

Figure 8:
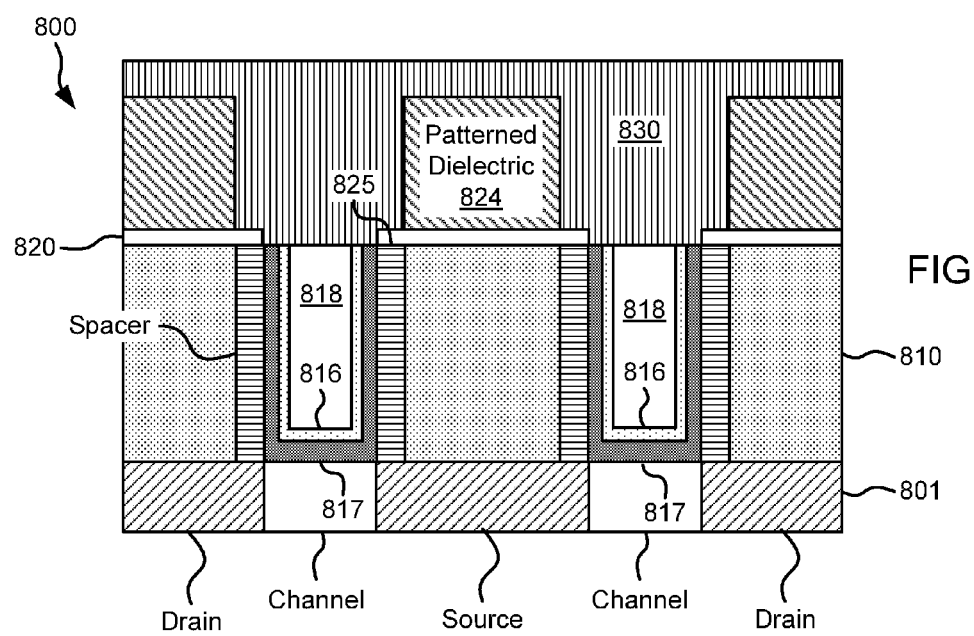
FIG. 8 shows a replacement metal gate with a seed layer and an oxide layer, after the dielectric cap material has been deposited on top of the structure, according to aspects of the present disclosure.

FIG. 8 shows a cross section 800 of a replacement metal gate with a seed layer 820 and a catalytically grown patterned oxide layer 824, according to aspects of the present disclosure, emphasizing the lateral recess of the sides of the openings of the patterned oxide layer 824 in order to promote deposition of the dielectric cap material directly above the spacer and gate oxide. A semiconductor substrate 801 may have source and drain regions and several channel regions. Bulk dielectric material 810 may be deposited on the semiconductor substrate 801 and spacers may penetrate through the dielectric material from its topside down to the top surface of the semiconductor substrate. Replacement metal gates made of gate metal 816 and a gate fill 818 may be located directly above channels in the semiconductor substrate 801. A conformally deposited gate oxide 817 may lie between the gate metal 816 and spacer or channel region to prevent current from travelling through the replacement metal gate to drain regions. Gate fill 818 may make up the remainder of the replacement metal gate and may extend up to the top edge of the dielectric material, the spacer, and the gate metal. Gate metal 816 and gate fill 818 may be made of elements described previously in FIG. 1.

In some embodiments, a seed layer 820 may have been deposited on top of the spacer and bulk dielectric material in order to promote catalytic growth of a patterned dielectric 824. The patterning may have been performed according to processes described in FIG. 2, above. The dielectric may be an oxide such as silicon dioxide or some other oxide resulting from catalytic cross-linking promoted by the seed layer 820. The seed layer may contain aluminum, as described previously in FIG. 2. During processing, an etch step may have been performed on the wafer surface to pull back the sides of the openings in the patterned dielectric 824. The etch step may be a liquid etch with some kind of acid that can isotropically etch the patterned dielectric 824. Such an isotropic etch may remove patterned dielectric 824 in both in a vertical direction, reducing the thickness of the patterned dielectric above the seed layer, and in a horizontal direction, enlarging the opening in the patterned dielectric above the replacement metal gate. Pullback of the side of the patterned dielectric 824 may expose a portion of the seed layer 820, and may further expose a region of the spacer or the gate oxide. Exposed region 825 may be directly exposed in areas where the seed layer has been eroded or ablated or otherwise removed from atop the spacer dielectric material. Seed layer loss may occur easily because the seed layer may be only one atomic monolayer thick in some embodiments.

A dielectric material 830 may be deposited on top of the wafer surface and within patterned dielectric openings. Excess dielectric material may be removed by methods such as chemical mechanical planarization to expose the top side of the patterned dielectric across the wafer, leaving behind isolated segments of dielectric material 830 to act as caps on top of replacement metal gates within the openings of the patterned dielectric corresponding with the pattern of the chelating mask molecules on top of the replacement metal gates. According to embodiments, the seed layer 820 on or next to the exposed spacer region 825 may be incorporated into the dielectric material in order to form part of the caps.

Figure 9:
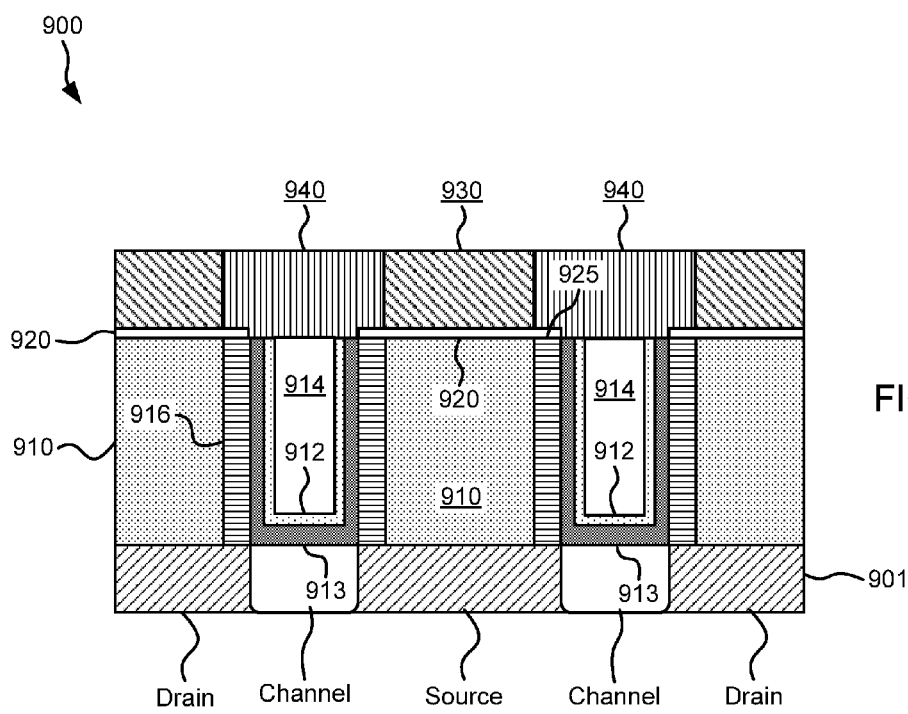
FIG. 9 shows a replacement metal gate after the dielectric cap has been planarized to expose an oxide layer, according to aspects of the present disclosure.

FIG. 9 shows a cross section 900 of a replacement metal gate after dielectric cap material has been planarized to expose a patterned dielectric layer 930, according to embodiments, emphasizing the isolation of the dielectric caps from each other after planarization, and the incorporation of any seed layer 920 material on the spacer 916 or gate oxide 913 into the dielectric cap. Semiconductor substrate 901 may have source regions, drain regions, and channel regions. Bulk dielectric material 910 may be on the top surface of the semiconductor substrate 901, and spacers 916 may extend from the top surface to the bottom of the bulk dielectric material, touching the top surface of the semiconductor substrate. A gate oxide 913 may line the interior surfaces of the spacers 916 and rest on the top of a channel region beneath the replacement metal gate. Replacement metal gates may have layer of gate metal 912 that covers the interior vertical surfaces of the gate oxide 913, and extending up to the top of the replacement metal gate. A gate fill 914 may make up the remainder of the volume of the replacement metal gate.

According to some embodiments, a seed layer 920 may be present on top of the bulk dielectric material 110 and on top of the spacers 916. The patterned dielectric layer 930 may be on top of the seed layer 920. An exposed region 925 of spacers 916 or the gate oxide 913 may be in contact with a dielectric cap 940, a portion of the seed layer 920 being incorporated into the dielectric cap 940 above the spacer 916. The seed layer 920 may be one or more atomic monolayers of a metal such as aluminum that was used to catalytically grow the patterned dielectric layer 930. In other embodiments, the seed layer may be absent and the patterned dielectric layer 930 may have been formed using epitaxial growth methods such as atomic layer deposition, as described in FIG. 2, above. The top surface of the stack may have been planarized such that the top sides of the patterned dielectric 930 and the dielectric cap 940 are even with each other, individual dielectric caps being isolated from each other by the patterned dielectric 930.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of manufacturing a field effect transistor, comprising:
   chelating a molecular mask to a replacement metal gate in the field effect transistor;
   forming, using the molecular mask to protect the replacement metal gate, a patterned dielectric layer on a bulk dielectric and gate dielectric barrier;
   exposing a region of the gate dielectric barrier;
   depositing a dielectric cap to touch the gate dielectric barrier and the replacement metal gate; and
   creating a contact opening to expose a semiconducting substrate next to the field effect transistor.

2. The method of claim 1 where the gate dielectric barrier is selected from a group consisting of a gate oxide and a spacer.

3. The method of claim 1, further comprising:
   planarizing the dielectric cap to expose the patterned dielectric layer.

\* \* \* \* \*